(12) United States Patent
Sorg et al.

(10) Patent No.: US 6,700,715 B2
(45) Date of Patent: Mar. 2, 2004

(54) OSCILLATION DAMPING SYSTEM

(75) Inventors: Franz Sorg, Aalen (DE); Stefan Xalter, Oberkochen (DE); Michael Muehlbeyer, Aalen (DE); Bernhard Gellrich, Aalen (DE); Frank Melzer, Utzmemmingen (DE); Thomas Ittner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/016,704

(22) Filed: Dec. 11, 2001

(65) Prior Publication Data

US 2002/0075574 A1 Jun. 20, 2002

(30) Foreign Application Priority Data

Dec. 15, 2000 (DE) .......................... 100 62 786

(51) Int. Cl.⁷ ................................. G02B 7/02
(52) U.S. Cl. .................. 359/824; 359/814; 359/822
(58) Field of Search ................. 359/813, 814, 359/822–824, 819

(56) References Cited

U.S. PATENT DOCUMENTS

| | | | |
|---|---|---|---|
| 3,552,271 A | 5/1971 | Suggs et al. | |
| 5,636,068 A | * 6/1997 | Tanaka | 359/814 |
| 5,825,561 A | * 10/1998 | Ohguri | 359/822 |
| 6,134,057 A | * 10/2000 | Ueyama et al. | 359/821 |

FOREIGN PATENT DOCUMENTS

| | | |
|---|---|---|
| EP | 0376107 | 7/1990 |
| EP | 0964281 | 12/1999 |
| EP | 0974868 | 1/2000 |
| WO | WO 0045067 | 8/2000 |

OTHER PUBLICATIONS

Kajiwara et al., "Large Scale Active Microvibration Control System Using Piezoelectric Actuators Applied Semiconductor Manufacturing Equipment", *Transactions of the Japan Society of Mechanical Engineers*, 63:615 (Nov. 1997).

* cited by examiner

Primary Examiner—Jordan M. Schwartz
Assistant Examiner—Jessica Stultz
(74) Attorney, Agent, or Firm—Welsh & Katz, Ltd.

(57) ABSTRACT

In an oscillation damping system, the oscillations which act on an optical element in an imaging device, in particular on deformation-decoupled mounts and manipulators in a projection illumination arrangement, in particular in a projection objective for microlithographic projection exposure objective lithography, are detected by sensors, by actuators waves with same or at least similar frequencies and amplitudes of anti-phases to the disturbing oscillations are generated and introduced in said mount.

23 Claims, 1 Drawing Sheet

OSCILLATION DAMPING SYSTEM

BACKGROUND OF THE INVENTION

The invention relates to an oscillation damping system for affecting an optical element in an imaging device, in particular deformation-decoupled mounts and manipulators in a projection illumination arrangement, in particular in a microlithographic projection exposure objective for the manufacture of semiconductors.

Especially in microlithographic projection exposure objective, very high imaging accuracies are required, oscillations introduced into the projection illumination arrangement, or its structures, having a very detrimental effect on the overall optics and therefore on the imaging accuracy.

In order to isolate the optical elements, e.g. lenses, from externally acting forces and deformations, it is known to connect the optical elements in deformation-decoupled fashion to outer structures, e.g. an outer mount. Such deformation-decoupled optical elements are, of necessity, relatively soft at the points of connection to the outer structure. This means that the natural frequencies become lower, which entails the risk that the optical elements can start to vibrate owing to externally excited oscillations, e.g. at machine frequencies, which in turn has a detrimental effect on the image quality of the illumination. For this reason, attempts have hitherto always been made to find a compromise between good deformation decoupling and a necessarily required minimum stiffness, so that the optical element does not experience oscillations.

SUMMARY OF THE INVENTION

It is an object of the present invention to provide a system with which the greatest possible deformation decoupling is achieved with correspondingly soft supporting or connecting points, but without externally acting oscillations having a detrimental effect on the optical element.

This object is achieved according to the invention with an optical mount unit comprising an optical element a mount holding said element, said mount comprising two units, which units are elastically coupled, and at least one active oscillation attenuator attached to said mount to affect oscillations of said elastically coupled units.

According to a further mode the present invention refers to an oscillation damping system for affecting an optical element in an objective, wherein the optical element is hold in a mount comprising two units, which units are elastically coupled, and where disturbing oscillations that occur being detected by sensors and then by actuators waves with same or at least similar frequencies and amplitudes of anti-phases to the disturbing oscillations generated and introduced in said mount.

According to a preferred mode the present invention refers to an oscillation damping system for affecting a lens in a microlithographic projection exposure objective.

According to the invention, oscillations are now detected by attenuators including sensors, whereupon actuators, especially piezoelectric elements, are activated in connection with a control system, especially an adaptronic control loop in such a way that waves directed in opposition, with respect to both amplitude and frequency, are activated by the actuators in such a way that the oscillations introduced from outside, in particular primary oscillations, are virtually completely or at least substantially eliminated.

In other words: the actuators generate waves with the same frequency and same amplitude, however of anti-phase, which results in an extinction of the disturbing oscillations. Of course, because of the many possibilities it is not generally possible to achieve complete extinction of all oscillations, although very strong damping can at least be ensured. Also oscillations or vibrations resulting from deformations can be damped with the attenuators.

In an advantageous configuration of the invention, the piezoelectric elements are provided as actuators in the form of thin plates, sheets or films, because in this way they can be integrated optimally into the structure.

A very advantageous configuration of the invention may consist in piezoelectric elements being provided as sensors, preferably in the form of thin plates, sheets or films.

The invention can be used particularly advantageously for deformation-decoupled mounts and manipulators. In this case, sensors are correspondingly distributed over the circumference, on a fixed or stationary outer ring and piezoelectric elements are provided as actuators, likewise distributed over the circumference, in or on an inner ring, which is elastically connected to the outer ring, or the optical element.

If the sensors and actuators are in this case arranged in the vicinity of joints, then oscillations or deformations induced externally via the outer mount can be deliberately counteracted by correspondingly activated actuators with anti-phase waves at the junction with the inner ring.

If, in a configuration according to the invention, the sensors are also designed as piezoelectric elements, then because of the deformations that occur at the joints and therefore length changes of the sensors that occur, the induced oscillations can be detected very exactly and oscillations that act in opposition, i.e. in anti-phase with same frequency and amplitude can be correspondingly generated.

BRIEF DESCRIPTION OF THE DRAWINGS

An exemplary embodiment of the invention is described below in outline with the aid of the drawing, in which.

DETAILED DESCRIPTION OF THE PREFERRED EMBODIMENTS

Figure 1:
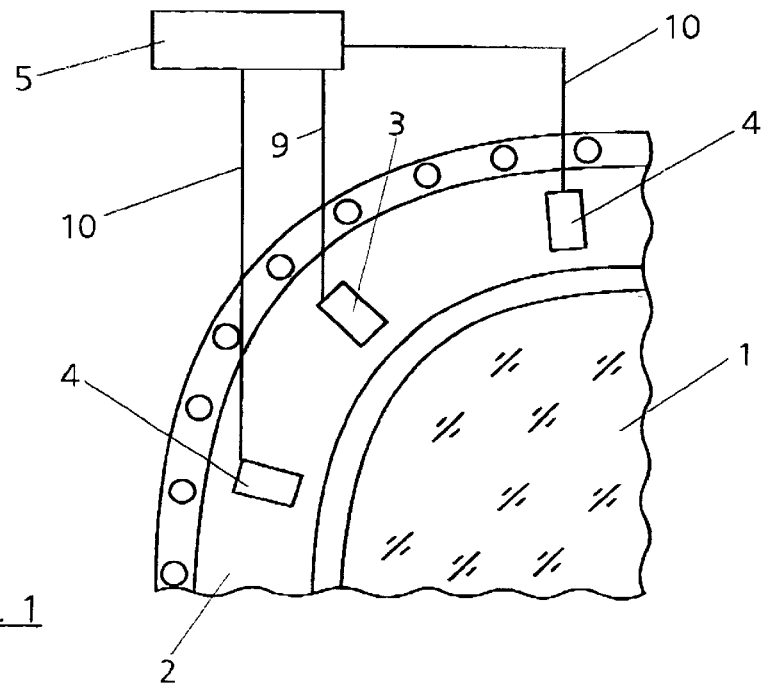
FIG. 1 shows an excerpt of a plan view of a lens as an optical element with a mount.

FIG. 1 represents, only schematically and in excerpt, a lens 1 as an optical element, which is supported in a mount 2 (not shown in detail). Active attenuators comprising oscillation sensors 3, oscillation actuators 4 and control systems receiving signals from the oscillation sensors 3 and driving the oscillation actuators 4, are arranged (not shown in detail) distributed over the circumference. Both the sensors 3 and the actuators 4 are piezoelectric elements in the form of thin plates, sheets or films and are in this way integrated into the structure. The oscillations detected by the sensors 3 are sent via control lines 9 to a computer 5 (not shown in detail) with an evaluation unit in which, after evaluation of the results from the sensors 3, the actuators 4 are activated in an adaptronic closed control loop through control lines 10, in such a way that frequencies that act in opposition to the introduced frequencies act with the same amplitude in the mount 2.

The sensors 3 can also detect the deformations affecting the mount 2, so that via the computing unit 5, the actuators 4 generate opposite deformations by anti-phase waves with the same frequency and the same amplitude.

Figures 2, 3, 4:
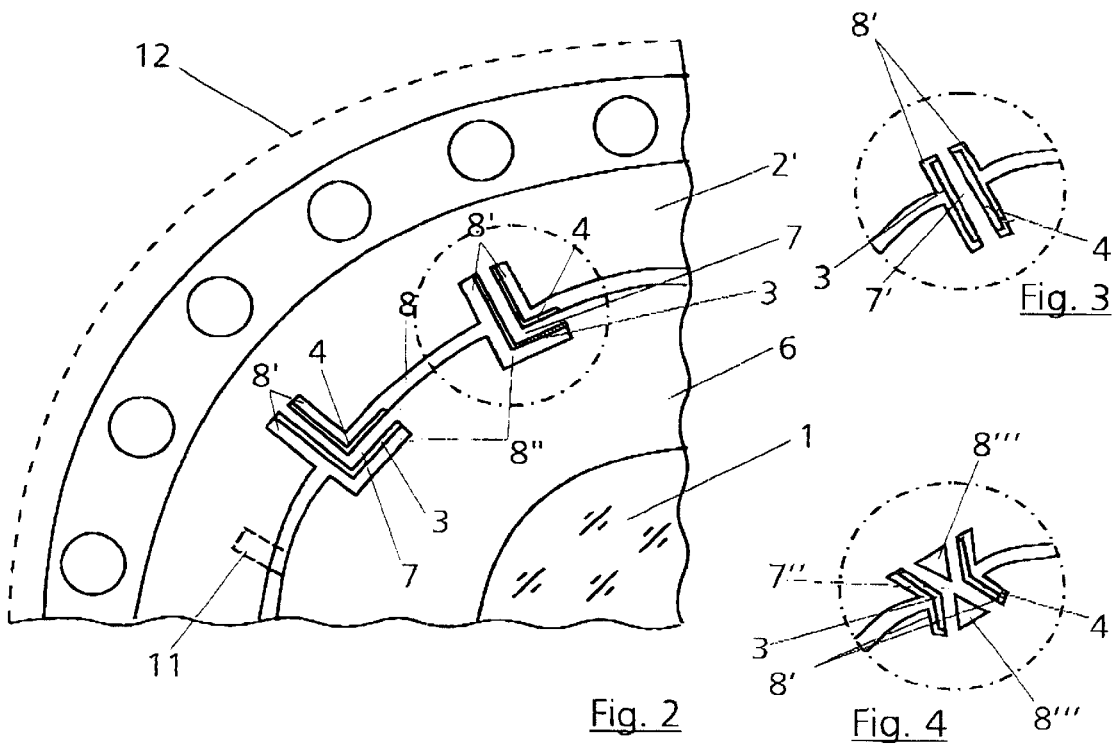
FIG. 2 shows an excerpt of a plan view of a lens as an optical element with a deformation-decoupled mount.
FIG. 3 shows another configuration of a solid-state joint corresponding to the dashed circular excerpt of FIG. 2.
FIG. 4 shows a further configuration of a solid-state joint corresponding to the dashed circular excerpt of FIG. 2.

A preferred exemplary embodiment, or a preferred field of use, of the system for damping oscillations are deformation-decoupled mounts, as represented in excerpt in FIG. 2. Deformation-decoupled mounts are known per se, for which reason details will not be entered into here. For example, reference may be made to DE 199 08 554 and P 199 01 295.

As can be seen from FIG. 2, the lens 1 is supported in an inner mount 6 which is connected to an outer mount 2' via narrow connecting links in the form of solid-state joints 7. To that end, a plurality of solid-state joints 7 are arranged distributed over the circumference between the outer mount 2' and the inner mount 6. The lens 2 can be part of a microlithographic projection exposure objective for manufacturing of semiconductors. Part of the housing of the objective 12 is shown in dotted lines of FIG. 2. The outer mount 2' and the inner mount 6 are integral and, to produce a deformation-decoupled connection, are separated from one another by an annular gap 8 with the exception of the solid-state joints 7. In the vicinity of the breaks in the annular gap 8, that is to say the solid-state joints 7, the annular gap 8 has gap continuations 8' which each extend outward in a radial direction and respectively on either side of the solid-state joints 7. One of the two gap continuations 8' is in this case further extended inward in the direction of the optical element 1 and provided with a widening 8" running at least approximately in a circumferential direction. In this way, the solid-state joints 7 are respectively provided with L-shaped gaps on both sides. Sensors 3 and actuators 4 are hence fitted, alternately facing one another, into these L-shaped gaps. The sensors 3 and the actuators 4 are applied as sheets and are connected to a computing unit 5 (not shown in detail in FIG. 2) in the same way as in FIG. 1. Oscillations or deformations, detected by the sensors 3, which occur in the solid-state joints 7 and would therefore be passed on via the solid-state joints 7 to the inner ring 6, and hence to the lens 1, are delivered via the control lines 9 to the computer 5, where they are forwarded via the control lines 10 to the actuators 4.

If "anti-frequencies" or "anti-deformations" are generated in this way via the correspondingly activated actuators 4, then the oscillations or deformations in the solid-state joints 7 are virtually eliminated. This means that even stronger deformation decoupling can possibly be achieved by correspondingly "softer" solid-state joints 7 with high elasticity without the risk of oscillations or vibrations for the lens 1.

Depending on the oscillations that occur, it may possibly be necessary to provide several adaptronic control loops instead of a single one. The number of sensors 3 and actuators 4, and the way in which they are arranged, will then depend on the design in question.

Instead of a solid-state joint 7 with L-shaped gaps, it is of course possible to use other embodiments which are suitable for the application of sensors 3 and actuators 4 in order to at least substantially eliminate externally introduced oscillations.

FIG. 3 represents a configuration corresponding to the dashed circular excerpt of FIG. 2, the solid-state joint being formed between the outer mount 2' and the inner mount by a simple link 7', which extends in a radial direction. The gaps 8' are in this case arranged on either side of the link. Instead of a purely radial path of the link 7 as the solid-state joint, of course, it is also possible to use links which are inclined with respect to the radial direction. In this case, of course, the gaps 8' also run obliquely instead of at a right angle.

FIG. 4 shows a configuration of a solid-state joint 7" which forms an x-shape with laterally adjacent gaps 8' and two holes 8" between the links.

In both cases, the sensors 3 and actuators 4 are in turn located laterally on the links in the gaps 8'. In the exemplary embodiment according to FIG. 4, sensors 3 and/or actuators 4 may optionally also be arranged on the inside of the links in the holes 8'''.

Manipulators 11 (see the dashed indication in FIG. 2) which enable the positional changes of the inner mount, and therefore of the lens 1, can be provided between the outer mount 2' and the inner mount 6, in the vicinity of the solid-state joints 7 or at a different point The sensors 3 and actuators 4 according to the invention can also act on or via the manipulators 11.

In the solution according to the invention, the piezoelectric elements are used in a double respect, namely, on the one hand, oscillations that occur lead to length changes of the piezoelectric elements present in the form of thin plates, sheets or films, which therefore bend correspondingly in the manner of a strain-gage strip. In the known way, these changes to the piezoelectric elements generate voltages, which are correspondingly detected and evaluated in the computer 5. When they are being used as actuators, the reverse effect of the piezoelectric elements is employed; in this case, the control lines 10 are used to supply the piezoelectric elements with voltages that lead to corresponding length changes or bending of the piezoelectric elements. These changes to the piezoelectric elements hence initiate oscillations in the adjoining structure. If these oscillations are then correspondingly controlled in such a way that they are opposite (anti-phase) and with the same frequency and the same amplitude to the unwanted oscillations introduced to the structure from outside, then significant damping takes place, if not actually substantial extinction of the unwanted frequencies.

What is claimed is:

1. An oscillation damping system for affecting an optical element in an objective, wherein the optical element is held in a mount comprising two units, first unit being formed as an outer ring fixed to a housing of the objective and a second unit being formed as an inner ring elastically coupled to the outer ring, and wherein sensors and actuators are arranged between the inner ring and the outer ring, and wherein disturbing oscillations that occur are detected by said sensors and then by said actuators, and oscillations with the same or at least similar frequencies and amplitudes of anti-phases to the disturbing oscillations are generated and introduced in said mount.

2. System as claimed in claim 1, wherein piezoelectric elements as actuators act on said mount.

3. The system as claimed in claim 2, wherein said piezoelectric elements are integrated into the optical element or the mount as actuators in the form of thin plates, sheets or films.

4. The system as claimed in claim 1, wherein piezoelectric elements are provided as sensors.

5. The system as claimed in claim 4, wherein said piezoelectric elements are provided as sensors in the form of thin plates, sheets or films.

6. The system as claimed in claim 1, wherein the outer ring is connected to the inner ring via joints and wherein sensors and actuators are arranged on both sides of the joints.

7. The system as claimed in claim 6, wherein said joints are designed as solid-state joints and the outer ring and inner ring are designed integrally.

8. The system as claimed in claim 7, wherein said solid-state joints are designed at least approximately in an L-shape.

9. The system as claimed in claim 7, wherein said solid-state joints are designed as links which extend in a radial direction between the inner ring and outer ring.

10. The system as claimed in claim 7, wherein said solid-state joints are designed as links which extend inclined to the radial direction.

11. The system as claimed in claim 7, wherein said solid-state joints are designed at least approximately in an x-shape.

12. An oscillation damping system for affecting a lens in a microlithographic projection exposure objective, wherein the lens is held in a mount comprising two units, said units being elastically coupled, one of the units being formed as an outer ring fixed to a housing of the objective and the second unit being formed as an inner ring elastically coupled to the outer ring, and wherein piezoelectric elements and actuators are arranged between the inner ring and the outer ring, and wherein disturbing oscillations that occur are detected by said piezoelectric elements and then by said actuators, and oscillations with the same or at least similar frequencies and amplitudes of anti-phases to the disturbing oscillations are generated and introduced in said mount.

13. The system as claimed in claim 12, wherein piezoelectric elements as actuators act on said mount.

14. The system as claimed in claim 13, wherein said piezoelectric elements are integrated into the lens or the mount as actuators in the form of thin plates, sheets or films.

15. The system as claimed in claim 12, wherein said piezoelectric elements are provided as said sensors in the form of thin plates, sheets or films.

16. The system as claimed in claim 12, wherein, the outer ring is connected to the inner ring via joints, and wherein said piezoelectric elements and said actuators are arranged on both sides of the joint points.

17. The system as claimed in claim 16, wherein said joints are designed as solid-state joints and the outer ring and inner ring are designed integrally.

18. The system as claimed in claim 17, wherein said solid-state joints are designed at least approximately in an L-shape.

19. The system as claimed in claim 17, wherein said solid-state joints are designed as links which extend in a radial direction between the inner ring and outer ring.

20. The system as claimed in claim 17, wherein said solid-state joints are designed as links which extend inclined to the radial direction.

21. The system as claimed in claim 17, wherein said solid-state joints are designed at least approximately in an x-shape.

22. An oscillation damping system for affecting a lens in a microlithographic projection exposure objective, wherein an optical element is held in a mount comprising two units, a first unit being formed as an outer ring fixed to a housing of the objective and a second unit being formed as an inner ring elastically coupled to the outer ring, and wherein sensors and actuators are arranged between the inner ring and the outer ring.

23. An oscillation damping system for affecting a lens in a microlithographic projection exposure objective, wherein an optical element is held in a mount comprising two units, wherein the units are elastically coupled, and wherein disturbing oscillations that occur are detected by sensors and then by actuators, said oscillations with the same or at least similar frequencies and amplitudes of anti-phases to the disturbing oscillations are generated and introduced in said mount.

* * * * *

UNITED STATES PATENT AND TRADEMARK OFFICE
CERTIFICATE OF CORRECTION

PATENT NO.    : 6,700,715 B2
DATED         : March 2, 2004
INVENTOR(S)   : Sorg et al.

It is certified that error appears in the above-identified patent and that said Letters Patent is hereby corrected as shown below:

Column 1,
Line 51, delete "…and where disturbing,…" and replace it with -- …and wherein disturbing… --

Column 4,
Line 5, delete "…two holes 8"…" and replace it with -- …two holes 8…' --
Line 14, delete "…different point The sensors 3…" and replace it with -- …different point. The sensors 3… --
Line 41, delete "…two units, first unit being…" and replace it with -- two units, a first unit being… --

Column 5,
Line 34, delete "…wherein, the outer ring…" and replace it with -- …wherein the outer ring… --

Signed and Sealed this

Twenty-eighth Day of September, 2004

JON W. DUDAS
*Director of the United States Patent and Trademark Office*